United States Patent [19]

Soltys

[11] Patent Number: 5,419,926
[45] Date of Patent: May 30, 1995

[54] AMMONIA-FREE DEPOSITION OF COPPER BY DISPROPORTIONATION

[75] Inventor: Joseph Soltys, London, Canada

[73] Assignee: Lilly London, Inc., Indianapolis, Ind.

[21] Appl. No.: 153,548

[22] Filed: Nov. 22, 1993

[51] Int. Cl.$^6$ ............................................. B05D 3/04
[52] U.S. Cl. ................................... 427/305; 106/1.18; 106/1.23; 427/443.1
[58] Field of Search ............................ 427/305, 443.1; 106/1.18, 1.23

[56] References Cited

U.S. PATENT DOCUMENTS

| | | | |
|---|---|---|---|
| 2,967,112 | 1/1961 | Fay et al. | 427/427 |
| 2,977,244 | 3/1961 | Kay et al. | 427/168 |
| 3,033,703 | 5/1962 | Schneble, Jr. et al. | 427/305 |
| 3,093,509 | 6/1963 | Wein | 427/98 |
| 3,257,215 | 6/1966 | Schneble | 427/305 |
| 3,403,035 | 9/1968 | Schneble | 427/443.1 |
| 3,776,740 | 12/1973 | Sivertz et al. | 106/1.05 |
| 3,962,494 | 6/1976 | Nuzzi | 427/305 |
| 3,963,842 | 6/1976 | Sivertz et al. | 427/305 |
| 4,102,702 | 7/1978 | Bahls | 106/123 |
| 4,192,686 | 3/1980 | Soltys | 106/123 |
| 4,220,678 | 9/1980 | Feldstein | 427/305 |
| 4,301,196 | 11/1981 | McCormack et al. | 427/305 |
| 4,315,055 | 2/1982 | Breininger | 427/305 |
| 4,450,191 | 5/1984 | Arcilesi | 427/443 |
| 4,525,390 | 6/1985 | Alpaugh et al. | 427/437 |
| 4,541,902 | 9/1985 | Kinoshita | 427/305 |
| 4,552,787 | 11/1985 | Chebiniak | 427/305 |
| 4,563,217 | 1/1986 | Kikuchi et al. | 106/123 |
| 4,581,256 | 4/1986 | Sommer | 427/305 |
| 4,617,205 | 10/1986 | Darken | 427/305 |
| 4,737,188 | 4/1988 | Bahls | 106/123 |
| 4,956,014 | 9/1990 | Kondo et al. | 106/123 |
| 5,075,134 | 12/1991 | Sanford | 427/162 |
| 5,094,881 | 3/1992 | Sanford | 427/162 |
| 5,145,715 | 9/1992 | Asano | 427/443.1 |

*Primary Examiner*—Bernard Pianalto
*Attorney, Agent, or Firm*—DeLio & Peterson

[57] ABSTRACT

An ammonia-free reducer is added to cupric ions to achieve reduction to cuprous hydroxide in a process for the deposition of metallic copper on a catalytically activated surface by rapidly reducing cupric ions in aqueous solution to cuprous hydroxide, without substantial reduction to elemental or metallic copper, and thereafter effecting controlled disproportionation of the resultant cuprous hydroxide to bring about the deposition of metallic copper. The ammonia-free reducer is preferably hydroxylamine or its salts in the presence of a water soluble alkali metal- or alkaline earth metal-hydroxide, more preferably sodium hydroxide. The process of reduction of cupric ions is further effected by adding to the solution an antiagglomerating agent for controlling the dispersion of the cuprous hydroxide, preferably a polyol such as sorbose or invert sugar. The process of disproportionation of the cuprous hydroxide is further effected by adding an activator comprising a hydroxycarboxylic acid or salt thereof, preferably citric acid or malic acid with sulfuric acid, to bring about the deposition of metallic copper principally on the catalytically activated surface, wherein the hydroxycarboxylic acid or salt activator is present in solution in an amount no greater than about one mole per mole of cuprous hydroxide.

43 Claims, No Drawings

AMMONIA-FREE DEPOSITION OF COPPER BY DISPROPORTIONATION

BACKGROUND OF THE INVENTION

1. Field of the Invention

The present invention is directed to a process for deposition of copper and, in particular, to an improved process and system for depositing metallic copper on a catalytically activated surface by controlled disproportionation of cuprous hydroxide.

2. Description of Related Art

The deposition of copper by means of disproportionation was disclosed in U.S. Pat. No. 3,963,842 to Sivertz et al., assigned to the assignee of the instant application. The patent described the electroless plating of copper onto silver, glass (preferably in manufacturing mirrors) or other catalytically activated surface by (1) rapidly reducing complexed cupric tetraamino ions in aqueous solution to complexed cuprous diamino ions, without substantial reduction to metallic copper and (2) thereafter effecting controlled disproportionation of the resultant cuprous ions to bring about the deposition of metallic copper principally on the surface. The initial reduction step was carried out by a class of reducing agents selected from nitrogenous materials containing one or two nitrogen atoms and having the formula:

X—NH—Y wherein X is hydrogen, hydroxyl, hydroxyl-substituted lower alkyl or benzene sulfonyl groups and Y is —NH$_2$. Specific members disclosed were hydrazine, salts of hydrazine with sulfuric acid or acetic acid, monosubstituted derivatives of hydrazine including 2-hydroxyethylhydrazine and p-hydrazino-benzene sulfonic acid, hydroxylamine, and salts of hydroxylamine with sulfuric acid or acetic acid. Co-reducers were also disclosed, including symmetrically disubstituted hydrazines used along with the hydrazine members, such as di-2-hydroxyethylhydrazine, hydrazo-benzene, and hydrazo-carbonamide, and other nitrogenous materials, for example, aminoguanadine bicarbonate. The use of hydroxylamine sulfate was preferred over the hydrazines.

In the preferred embodiment of this process it was believed necessary to use ammonium hydroxide in conjunction with hydroxylamine sulfate to convert copper from the +2 (cupric) oxidation state to the +1 (cuprous) form. The cuprous diammino ion would then disproportionate to copper metal and the cupric state when mixed with certain organic acid activators, such as hydroxy carboxylic acids, more preferably alpha hydroxy acids, such as glycolic, malic, tartaric, saccharic, citric and/or lactic acid and the like, dicarboxylic acids, such as succinic acid and the like, and sulfamic acid. Alternatively, an activator-modifier used for disproportionation may be a chelating amine such as ethylenediamine, triethyltetraamine, analogous alkylamines, or a mineral acid activator such as sulfuric or phosphoric acid with a modifier of said organic acids, said chelating amines or combinations thereof. Following disproportionation, copper in the metallic state would deposit on the glass, silver metal film or other activated surface.

An ammoniacal cuprous complex solution was also specified in a less successful process for depositing copper by disproportionation disclosed in U.S. Pat. Nos. 2,967,112 and 2,977,244.

Since its introduction in the mid-1970s, the aforementioned Sivertz et al. process has worked well in general and has been licensed and used by numerous mirror manufacturers around the world. However, there are certain aspects of the process in which improvement would be welcomed. The ammonia-cuprous complex used in the aforementioned process would be destroyed within minutes if exposed to air so that it generally had to be formed in an enclosed container. The only way the cuprous complex could be saved was if a nitrogen blanket was placed over it, or if it was otherwise shielded from contact with oxygen, which was not always practical. The metallic copper film deposited using the Sivertz et al. process also has a tendency to tarnish upon exposure to water vapor, especially when fugitive ammonia vapors from the process are present, which complicates protection during processing. The reaction rate of the process has also not been considered to be amenable to control. Furthermore, manufacturers are always looking for improved reaction efficiency to conserve material costs and speed process time. Thus, there has been a long-felt need for improvement of the process of the Sivertz et al. patent.

Recently, environmental regulations in the U.S. and elsewhere in the world 3,5 are beginning to regulate the discharge of ammonia into water sewers and streams, and in the workplace environment. Compliance with such regulations are requiring companies to eliminate the use of ammonia altogether in their processes, or to install expensive pollution control equipment to eliminate the presence of ammonia in the effluent stream and the workplace. Conventional technology and best available equipment that could be used to remove ammonia from an effluent stream is costly and not very efficient. Air stripping merely places the ammonia in the air and does not eliminate a pollution product. The destruction of ammonia can also be accomplished by the use of chlorine, but that system results in the formation of chlorinated organic compounds which present potential pollution and health hazards. Also, the preferred process has utilized hydroxycarboxylic acids such as citric acid in the activator-modifier, but has required use of such organic acid in an amount which causes a significant chemical oxygen demand and biological oxygen demand upon the effluent. Use of a significantly lower amount of citric or other organic acid would help from a pollution standpoint to control the amount of undesirable reaction products.

Bearing in mind the problems and deficiencies of the prior art, it is therefore an object of the present invention to provide an improved process for depositing copper which eliminates the use of ammonia, and the associated problems entailed with controlling and removing ammonia in the process.

It is another object of the present invention to improve the efficiency of the aforedescribed Sivertz et al. process for depositing copper.

It is a further object of the present invention to provide a method for controlling the reaction rate of the aforedescribed Sivertz et al. process for depositing copper.

It is yet another object of the present invention to improve the aforedescribed process for depositing copper by reducing the amount of organic acid needed for disproportioning the cuprous ions.

It is a further object of the present invention to provide an electroless deposited copper coating film that does not readily tarnish upon exposure to water vapor.

It is yet another object of the present invention to improve the aforedescribed process for depositing copper by eliminating the need for a nitrogen blanket over the cuprous complex or otherwise holding the cuprous complex in an enclosed container.

It is a further object of the present invention to provide a cuprous complex for use with the aforedescribed process for deposition of copper in which the cuprous complex solution can be prepared and easily held or stored for relatively long periods of time prior to applying the copper film to the desired substrate by disproportionation.

It is yet another object of the present invention to provide a system of compositions for achieving the aforedescribed objects.

SUMMARY OF THE INVENTION

The above and other objects, which will be apparent to those of ordinary skill in the art, are achieved in the present invention which relates to a process for the deposition of metallic copper on a catalytically activated surface by rapidly reducing cupric ions in aqueous solution to cuprous ions, which instantly convert to insoluble cuprous hydroxide, without substantial reduction to elemental or metallic copper, and thereafter effecting controlled disproportionation of the resultant cuprous hydroxide to bring about the deposition of metallic copper principally on the surface. In a first aspect, the process includes adding to the cupric ions an ammonia-free reducer to achieve reduction to the cuprous ions. The ammonia-free reducer is preferably hydroxylamine and its salts with a water soluble alkali metal- or alkaline earth metal- hydroxide or other non-ammonia containing alkaline compound, more preferably sodium hydroxide. The process of reduction of cupric ions is further effected by adding to the solution an antiagglomerating agent for controlling the dispersion of the cuprous hydroxide precipitate, preferably a polyol such as sorbose, fructose, dextrose or invert sugar. The antiagglomerating agent is present in an amount insufficient to effect reduction of the cupric ions by itself.

The process of disproportionation of the cuprous hydroxide is effected by adding an acid activator comprising a hydroxycarboxylic acid or salt thereof to bring about the deposition of metallic copper principally on the catalytically activated surface, wherein the hydroxycarboxylic acid activator is present in solution in an amount no greater than one (1) mole per mole of cuprous hydroxide. The hydroxycarboxylic acid or salt activator-modifier is preferably citric acid, malic acid, tartaric acid or maleic acid, and further contains a mineral acid such as sulfuric acid. To the activator there may also be added a rate modifier selected from the group consisting of Surfine, glycine, triethylenetetramine, and Flocon 100, or other surface active additives which may retard the uncontrolled decomposition to useless copper metallic sludge rather than the desired copper deposition.

In another aspect, the invention comprises an ammonia free system for depositing copper on a substrate comprising an aqueous solution containing cupric ions, an aqueous cuptic reducer solution containing a nitrogenous compound, an aqueous alkali metal or alkaline earth metal solution, and an aqueous activator solution containing a hydroxycarboxylic acid or salt thereof or a mineral acid in combination with a hydroxycarboxylic acid or salt. The cupric reducer solution preferably comprises hydroxylamine and its salts, while the alkali metal-or alkaline earth metal- hydroxide or other non-ammonia containing alkaline compound, is preferably sodium hydroxide, to effect reduction of the cupric ions to cuprous hydroxide. The system may further contain an antiagglomerating agent, preferably a polyol, more preferably sorbose or invert sugar, to keep the cuprous hydroxide dispersed as fine particles. The antiagglomerating agent is present in an amount insufficient to effect reduction of the cupric ions. The aqueous activator solution preferably comprises a hydroxycarboxylic acid or salt in an amount no greater than about 65 g/l, the hydroxycarboxylic acid or salt activator-modifier preferably comprising citric acid, malic acid, or tartaric acid, and further containing a mineral acid. A rate modifying, surface active agent of the type previously described may also be incorporated in the system.

DESCRIPTION OF THE PREFERRED EMBODIMENTS

The process of the present invention is an improvement to the aforedescribed process of U.S. Pat. No. 3,963,842, the disclosure of which is hereby incorporated by reference. While the invention can be utilized to deposit metallic copper on a variety of substrates or catalyzed surfaces, it is believed particularly useful in depositing copper on a layer of silver on glass, or directly on the glass itself, to make mirrors. The glass surface may first be supersensitized by applying a stannous chloride solution followed by ammoniacal silver nitrate, by well known methods. Where the copper is to be deposited on a layer of silver, any of the prior art methods of silver deposition may be utilized, such as the methods disclosed in U.S. Pat. No. 3,776,740 to Sivertz et al., U.S. Pat. No. 4,102,702 to Bahls, or U.S. Pat. No. 4,192,686 to the present inventor. A preferred method for depositing silver is disclosed in U.S. Pat. No. 4,737,188 to Bahls. Once the copper layer is deposited, a protective resin or other coating is applied over the 3,5 copper, such as the lead-free resins disclosed in U.S. Pat. No. 5,075,134 to Sanford, and in U.S. Pat. No. 5,094,881 Sanford et al. The disclosures of all these aforementioned patents are hereby incorporated by reference.

The system of the present invention may be made up by either three (3) or four (4) components. These components are provided as aqueous solutions, which solutions may be provided in concentrated form for shipment and storage prior to dilution with deionized water to working strength.

The first component includes the cupric ions, preferably from a non-amine complex cupric salt such as a sulfate or nitrate salt and, more preferably, in the form of copper sulfate pentahydrate ($CuSO_4.5H_2O$). A cupric to cuprous reducer solution which may be provided separately as a second component, but is more conveniently included in the first component, contains a nitrogenous compound, optionally with a co-reducer, preferably one or more of the compounds described previously in the '842 patent such as hydroxylamine and its salts, most preferably hydroxylamine sulfate. Other reducers may include hydrazine, aminoguanidine bicarbonate, carbohydrazide, and dithionite, or any other compound capable of reducing cupric ions to the cuprous state without ammonia. The concentration of the nitrogenous compound or reducer can range from about 25 to 65 grams per liter, preferably at least about 45 grams per liter, and must be sufficient to reduce all the cupric ions to cuprous hydroxide, as shown by the stoichiometric equation when the reducer is hydroxylamine sulfate:

$$10NaOH + 4CuSO_4 + (NH_3OH)_2SO_4 \rightarrow 4Cu(OH)\downarrow + N_2O\uparrow + 5Na_2SO_4 + 7H_2O$$

Reduction of the cupric ions is accomplished by the addition of the third component, a water soluble alkali metal- or alkaline earth metal- hydroxide, preferably sodium or potassium hydroxide, or other non-ammonia containing alkaline agent such as sodium or potassium carbonate, to supply alkalinity to the mixture of cupric ions and reducing agent in the stoichiometric ratio of the above reaction equation. Sodium hydroxide is the preferred alkali metal- or alkaline earth metal- hydroxide. The reaction results in the rapid production of cuprous ions which instantly precipitate as the cuprous hydroxide precipitate which has the appearance of "orange mud". Additionally, nitrous oxide gas is formed as bubbles leaving the reaction vessel.

To act as an antiagglomerating agent, and thereby keep the Cu(OH) particles from forming large flocs or clumps, the cuprous reducer solution added to the first component preferably includes as an optional component a polyhydric sugar or alcohol (polyol), such as dextrose, fructose, glucono-delta-lactone, sodium glucoheptonate, L-sorbose, invert sugar, sucrose, D-galactono-gamma-lactone, 2-keto-D-gluconic acid, glycine, D-mannose, D-galactose, and the like. The preferred polyols are sugar compounds such as sorbose and invert sugar. While such compounds can theoretically be used to reduce copper, the amount of polyol employed in this instance is below that sufficient to reduce the amount of cupric ions to the cuprous state. The concentration of the polyol can range from about 1 to 200 grams per liter per mole of copper salt used, but is preferably about 10 to 100 grams per liter, and most preferably about 65 to 75 grams per liter per mole of copper salt. While not wishing to be limited by theory, the effect of the polyol addition appears to be in preventing hydrogen bonding between resultant cuprous hydroxide molecules. It is believed that the cuprous hydroxide molecules formed during the initial reduction of cuprous ions in the first component, tend to form hydrogen bonds to the polyols (along the hydroxyl groups) instead of to other cuprous hydroxide molecules, thereby keeping the cuprous hydroxide precipitate highly dispersed as relatively small particles. This has been found to ultimately result in more uniform plating of metallic copper as a result of the second step (disproportionation reaction).

As stated previously, the reducer may be provided as a separate or second component solution which can be added to the first cupric component solution just prior to adding the third component solution, preferably sodium or potassium hydroxide. The preferred order of addition is that of component two (the reducer) followed by component three (the alkali metal or alkaline earth metal hydroxide). If the alkali metal or alkaline earth metal hydroxide is added to the cupric solution before the reducer, the resultant cupric hydroxide precipitate will make addition of reducer solution difficult, thus slowing down the formation of cuprous hydroxide. Regardless of the desired cuprous hydroxide suspension (orange mud), the preferred ratio of cupric salt, hydroxylamine reducer and alkali metal or alkaline earth metal hydroxide is shown by the above stoichiometric equation, although variations of either reducer or alkali metal or alkaline earth metal hydroxide ratios in less than the stoichiometric amount will result in less yield of cuprous hydroxide. Similarly the use of more than the stoichiometric amount is wasteful but in both cases the cuprous hydroxide is produced in the desired state.

Unlike the Sivertz et al. '842 patent, the making and storing of the cuprous hydroxide mud suspension can be performed in open vessels and stored without a nitrogen gas blanket to exclude air, and if necessary held for months without oxidizing back to cupric compounds. This feature allows the use of simple open 5 tanks for all components and resultant cuprous hydroxide which by contrast to the Sivertz et al. process required expensive equipment when used in industrial quantities.

To those familiar with copper chemistry, it is evident that certain anions which form insoluble salts with cuprous ions, other than hydroxide as the anion, should be avoided both as choice of reactants or as impurities in the reactants. These anions are notably chlorides, iodides, sulfides, cyanides and thiocyanates. This is not always feasible in manufacturing environments and sodium chloride impurities in the alkali metal or alkaline earth metal hydroxide should preferable be less than 300 ppm. On the other hand, carbonate which may be added or is usually present in sodium hydroxide as sodium carbonate ($Na_2CO_3$), has been shown to have a positive effect on the plating efficiency when present in amounts up to about .33% of the weight of the sodium hydroxide, although excess amounts will cause undesirable mottle pattern to the copper deposit.

In order to effect controlled plating of the copper on a catalytically activated surface, the cuprous hydroxide resulting from combination of the first, second and third components, a fourth component containing an organic acid activator must be added to the cuprous hydroxide. This fourth component, or activator-modifier, is preferably a hydroxycarboxylic acid activator, or a salt of a hydroxycarboxylic acid, more preferably an alpha hydroxy acid such as malic acid, citric acid or tartaric acid. The activator can be modified by the addition a mineral acid such as sulfuric, phosphoric or sulfamic acid, or an amine such as ethylenediamine, triethylenetetramine or analogous alkylamines. As used herein, "mineral acid" includes partially neutralized forms of such acids, such as sodium bisulfate. The mineral acid may be used without the organic acid activator, but results in a less desirable chalky appearance to the deposited copper. It is preferred that an activator-modifier is used, comprising sulfuric acid with either citric acid, malic acid, tartaric acid, or a combination thereof.

Alternatively, the hydroxycarboxylic acid can be included in the cupric salt solution (first solution), thereby requiring the mineral acid to be added as the activator-modifier (fourth component). The hydroxycarboxylic acid in this instance can be added as a salt, i.e., as an alkali metal or alkaline earth metal salt, to the first component. The hydroxy carboxylic acid or salt can be added to either or both of the first or fourth component, but is preferably added in the fourth component in acid form. If included in the first component, for example, the salt of the hydroxycarboxylic acid may be in the form of a citrate, tartrate or malate.

The inorganic acid preferably has a concentration range from about 40 to 100 milliliters per liter when the first component contains copper ions from the use of 220 g/l of $CuSO_4.5H_2O$. Surprisingly, the organic acid or salt thereof may be used in lower amounts than the 200 grams per liter employed in the Sivertz et al. '842 patent, and its concentration preferably ranges from about 40 to 120 grams per liter, preferably at least about 60 grams per liter, most preferably about 65 grams per liter. This translates to less than one mole of organic acid or salt per mole of cuprous hydroxide, preferably less than one-half mole of organic acid or salt per mole of cuprous hydroxide. Upon addition of the acid activator, the pH of the entire solution drops below 7, and preferably below 3. It is believed that the cuprous oxide may be dissolved to cuprous ions, and probably become complexed with the hydroxycarboxylic acid, so that free cuprous ions become mobile for the disproportionation reaction. The reaction will work with either the mineral acid or organic acid alone, but the deposited copper has been found to be of poorer quality and the efficiency lower than with the combination of mineral and organic acids described above.

The preferred system of the present invention comprises the following preferred compounds in aqueous solutions (amounts given for concentrated form):

CU-275 (Copper Solution)
275 g/l copper sulfate pentahydrate

CU-1C (Reducer Solution)
184 g/l hydroxylamine sulfate
66 g/l L-sorbose

CU-100 (Copper+Reducer Solution)
4 parts CU-275
1 part CU-1C

CU-200 (Alkali Metal Solution)
380 g/l sodium hydroxide.

CU-300 (Activator Solution)
65 g/l citric, malic or tartaric acid
80 ml/l sulfuric acid (98%)
0.1 ml/l Surfine WNT-A It has been found that the addition of certain compounds can act to control the speed of the reaction and actually inhibit formation of the cuprous sludge or mud in the combined solutions during the copper deposition process according to the present invention, which results in higher plating efficiency. Such modifiers did not have the ability to control the reaction in the prior art ammonia disproportionation system. Suitable modifiers to be added to the CU-300 activator solution and which were found to favorably control the reaction include Surfine WNT-A, a detergent, wetting agent and dispersant which is the free acid form of an ethoxylated fatty alcohol carboxylate (an ethylene oxide condensate), available from Finetex, Inc. of Elmwood Park, N.J.; Rochelle salt (potassium-sodium tartrate); glycine; triethylenetetramine; and Flocon 100, an antiscalant available from Pfizer Inc. Other modifiers include the following surfactants:

Modifier
P. E. Soapbark FA—Meer Corporation, North Bergen, N.J.
Quillaja Extract 2F—Meer Corporation, North Bergen, N.J.
Alkanol WXN—E.I. dupont de Nemours, Wilmington, Del.
Alkanol XC—E.I. dupont de Nemours, Wilmington, Del.
Triton X-155 Rohm & Haas, Philadelphia, Pa.
Decersol TO75—American Cyanamid, Wayne, N.J.
Rexowet RW—Emkay Chemical Company, Elizabeth, N.J.
Acrilev AM—Finetex, Inc., Spencer, N.C.
Eccosol P TexAII Products, Pointe Claire Dorval, Quebec
Witconate SCS—Witco Chemical Corp., New York, N.Y.
Witconol PS—Witco Chemical Corp., New York, N.Y.
Antarox RC520—GAF Corporation, New York, N.Y.
P. E. Soapbark FA is an amphoteric long chained glycoside;
Quillaja Extract 2F is an amphoteric long chained glycoside;
Alkanol WXN is a nonionic fatty alcohol-ethylene oxide;
Alkanol XC is a nonionic sodium alkyl naphthalene sulfonate;
Triton X-155 is a nonionic alkylaryl polyether alcohol;
Decersol TO75 is an anionic sulfonated ester;
Rexowet RW is an anionic sulfonated aliphatic mono & diester;
Acrilev AM is an anionic phosphate ester, potassium salt;
Eccosol P is an anionic ethyloxide condensate (alkaline stable);
Witconate SCS is an anionic sodium cumene sulfonate;
Witconol PS is an anionic polyglycerol fatty acid ester;
Antarox RC520 is a nonionic modified linear aliphatic polyether; and
Flocon is an anionic polyacrylate.

These rate modifiers and sludge inhibitors may be incorporated into the fourth component described above in concentrations from about 0.1 to 10 grams per liter, and in concentrations given in examples of this patent. Additionally, it has been found that other benefits in plating efficiency and/or copper deposition may be achieved by adding to the rate modifier acidic complexers such as iminodiacetic acid and hydroxyethylethylenediaminetriacetic acid in an amount of about 50 g/l, boric acid in an amount of about 10 g/l, and a surface active agent such as Atcowet C (available from Bostik South, Inc. of Greenville, S.C.), in an amount of about 0.1 to 1.0 g/l. Atcowet C is an anionic alkylaryl polyphosphate surfactant. All of the above said additions are best made to the CU-300 activator solution.

To practice the process of the present invention, a suitable substrate is prepared to receive the layer of metallic copper. In the example of producing mirrors, the glass surface is either sensitized with stannous salts and washed in a 1% solution of palladium chloride or silver nitrate (where a copper mirror on glass is desired), or coated with a layer of silver, according to the Bahls '188 patent (where a silver mirror on glass with a copper backing is desired). The CU-100 component containing the cupric ions, nitrogenous reducer, and antiagglomeration agent is mixed with the CU-200 component containing the ammonia-free alkali metal or alkaline earth metal solution to rapidly reduce the cupric ions to cuprous hydroxide. Where the components contain copper sulfate, hydroxylamine sulfate and sodium hydroxide, the reaction for producing the cuprous complex is as follows:

$$NaOH + 4CuSO_4 + (NH_3OH)_2SO_4 \rightarrow$$
$$4Cu(OH)\downarrow + N_2O\uparrow + 5Na_2SO_4 + 7H_2O$$

The cuprous hydroxide formed appears as an orange precipitate formed with very fine particle size which allows one to achieve the most uniform copper deposit. The preferred polyol antiagglomerating agent enables the cuprous hydroxide to be dispersed as a small particles which allows pouring or spraying as if it were a clear solution. The pH of the cuprous hydroxide is 10 to 11, but is over 12 if excess sodium hydroxide is used. According to this invention, the cuprous hydroxide formed by the reaction of CU-100 and CU-200 may be used immediately, or may be stored for future use.

To deposit elemental metallic copper on the desired substrate, the cuprous hydroxide is then mixed with the CU-300 component containing the activator or activator-modifier. Where the CU-300 component contains an acidic activator or activator-modifier, the amount of acid utilized is chosen so that the reacted effluent has a terminal pH of below 7, preferably 1–4, more preferably 1–2. The CU-300 component may be mixed with the cuprous hydroxide from the reaction of CU-100 and CU-200 by pouring them together over the surface to be copper plated, or by spraying them simultaneously over the surface. Disproportionation of the cuprous ions causes reduction and deposition of a substantial portion of the copper ions as elemental, metallic copper on the catalyzed surface, as well as oxidation to the cupric state of the remaining cuprous ions in the reacted solution effluent.

Reaction temperatures may range from about 10°–50° C., preferably in the range of about 15°–30° C. for optimum results, i.e., higher efficiency and minimum time for formation of sludge. Higher temperatures tend to cause a decrease in plating efficiency by formation of metallic copper particles (sludge) rather than plating on the surface. Apart from the formation of copper sludge, the reaction efficiency is further decreased by the reaction of the cuprous salt with oxygen in the atmosphere during deposition. This problem can be overcome, if desired, by blanketing the reaction surface with nitrogen gas, carbon dioxide gas or other inert gas, or otherwise substantially excluding oxygen, to improve reaction efficiency.

To deposit copper on a silvered surface inside a standard 250 ml laboratory glass beaker with the preferred concentrated CU-100, CU-200 and CU-300 components described previously, the following procedure is used:

Take 37.5 ml of the CU-100 Solution and add 9 ml of the CU-200 solution. Dilute to 110 ml with deionized water and mix well. A yellow-orange precipitate is formed which is the cuprous hydroxide. The cuprous hydroxide is extremely fine in particle size and is prevented from agglomerating by the presence of the polyol. Then take 34 ml of the CU-300 solution and in a separate container dilute to 100 ml with deionized water.

Take 1 ml of the diluted CU-100 solution (to which has been added the CU-200 solution), which may be called the A solution, and 1 ml of the diluted CU-300 solution, which may be called the B solution, and pour simultaneously into the silvered beaker. The solutions are swirled gently for 10 seconds and placed on the bench at rest for 50 seconds. A uniform copper film is deposited over the silver layer. The solutions are then rinsed from the beaker and the excess water is drained.

To calculate the efficiency of the reaction, the copper film is then removed from the silver film by contact with an ammonium hydroxide solution in the presence of air until the copper deposit is dissolved and the solution titrated with 0.01M ethylenediaminetetraacetate solution using Murexide as the end point indicator. Then the spent copper solution is ammoniated and titrated separately for copper content. The plating efficiency may then be calculated from $\times 100\%$ where $T_1$ is the ml of titrant used to determine the copper deposit and $T_2$ is the ml of titrant used to determine the copper in the spent solution.

For the preferred compositions described previously, the copper deposited will be uniform and substantially free of streaks or mottled appearance. Reaction efficiencies have been found to range up to 12% to 18% under normal atmospheric (aerobic) conditions, or even higher under anaerobic conditions, which is significantly higher than the 11% previously achieved by use of the ammoniacal solution in the process of the '842 Sivertz et al. patent.

EXAMPLES

The following illustrative examples are given to more particularly illustrate the specific details of the practice of the present invention. Equivalent procedures and quantities will occur to those skilled in the art and, therefore, the following examples are not meant to define the outer limits of the present invention, these being defined by the appended claims. All references to percentages in the examples, as throughout the specification, are to weight percentages, unless otherwise identified.

Example 1

The method previously described to copper a beaker was used but the beaker was not activated with stannous sensitizer or treated with palladium ions or silver ions to activate the surface. Then 3ml of solution A and 3 ml of solution B (made with citric acid) were added to the beaker and the mixture allowed to react for about 3 minutes. A reddish metallic precipitate formed but almost no plating occurred. A pH of 1.7 was measured for the reaction. The metallic sludge was filtered and the amount of copper metal produced was assayed and the efficiency of the process was then calculated. Several repeated tests gave an efficiency of metal production which averaged 32%. The theoretical maximum for disproportionation is 50%. This demonstrates the feasibility of the process when the reaction is to be carried out on a catalytically activated surface or otherwise conductive metal surface such as silver metal surface or other surfaces known to be receptive to electroless plating as known to those skilled in the art of electroless plating.

Example 2

The procedure described in example 1 was repeated but this time in a beaker which was sensitized and given a coating of metallic silver. The CU-300 only contained sulfuric acid and citric acid (less the Surfine additive). After the mixtures of solutions A and B were swirled in the beaker by hand motion for 60 seconds, the mixture was dumped into a second untreated beaker. The first beaker now contained a bright copper metallic coating over the silver. Both the copper in the first beaker and the second beaker were determined and the deposition reaction found to be about 6 to 8%. This demonstrates that the process is electroless and that the reaction efficiency makes the process feasible.

Example 3

To further demonstrate that the process is a true electroless process, the procedure described in example 1 was repeated in a beaker which was sensitized and then treated with a dilute solution of palladium chloride or silver nitrate. Such beakers are called catalytically activated or supersensitized to those skilled in the art of electroless plating. The beaker appeared virtually transparent except for a light grey tint indicating that the surface was supersensitized. When the mixture of solutions A and B were added to the beaker and the solutions moved by hand swirling of the beaker for 60 seconds, a bright coating or copper metal appeared in the beaker, converting the otherwise transparent beaker into a copper glass mirror. This demonstrates that the process is not one described in the literature as galvanic displacement or immersion plating which is usually demonstrated by placing an iron nail into an acidic solution of copper sulfate to coat the nail with copper.

Example 4

To demonstrate that the hydroxycarboxylic acid may be used as a salt, preferably the sodium or potassium salt, 100g/l of sodium citrate was added to the CU-275 (copper solution). Then the dilute cuprous A solution was prepared in the same manner as previous examples using CU-1C. to make CU-100 and then reacting the CU-100 with CU-200 as previously described. The cuprous precipitate in this case appeared yellow-orange in color which suggested that some of the cuprous might be in the form of cuprous citrate, but chemical analysis indicated that the cuprous precipitate was predominantly cuprous hydroxide. The cuprous A solution was then reacted in a silvered beaker with a B solution made from CU-300 solution containing only 100ml of mineral acid, namely, sulfuric acid, which had been diluted 3.3 times. When 1 ml of solution A and 1 ml of solution B were reacted for 1 minute, the copper deposit was bright, the plating efficiency was 5.9%, and the final pH was about 1.3. This demonstrates that a normal reaction is obtained when the hydroxycarboxylic acid or salt is either in the CU-275 or CU-100, 100, provided that some additional mineral acid is included in the CU-100 to compensate for the alkalinity provided by the sodium ions from the hydroxycarboxylic acid salt.

Example 5

A test was run to demonstrate whether additional benefit is gained when the disproportionation plating process is carried out in the absence of oxygen normally found in air. The deposition of copper was carried out in silvered beakers as previously described. In one case, the reactant solutions A and B were added to the beaker in the presence of air. A plating efficiency of 11% was obtained. In the other case, the beaker was continuously flushed with nitrogen from a compressed cylinder of nitrogen. The reactants were added to the beaker with the nitrogen continuously flushing during the 1 minute reaction. In the second case, the plating reaction was 23%, indicating that atmospheric oxygen is one of the causes of loss of plating efficiency, along with the other cause, metallic sludge production. This example indicates that it is practical to consider the use of an inert gas blanket (anaerobic conditions) over the reaction surface.

Example 6

A dilute solution A was prepared from CU-100- and CU-200, except that sodium carbonate was substituted mole per mole for the usual sodium hydroxide metal hydroxide. In this case, the reaction of CU-100 and CU-200 took about 30 minutes, in comparison to the usual 1 to 2 minutes when sodium hydroxide is used. Then 1 ml of solution A was reacted with 1 ml of diluted B solution as in the previous examples. The B solution was made from sufficient CU-300 such that the reaction pH in the silvered beaker was between 1.0 and 2.0. The reaction efficiency was about 6% and the copper deposit bright. Also, some carbon dioxide gas was evolved during the deposition process but not in sufficient enough quantity to act as an inert gas blanket. The evolution of carbon dioxide gas did help to disperse the cuprous precipitate more uniformly over the substrate. This demonstrates that other non-ammonia containing alkaline compounds can be employed as the third component with additional benefits.

Example 7

A test was run to demonstrate whether other hydroxycarboxylic acids may be used in place of citric acid. The method used in previous examples was followed using CU-100 and CU-200 to prepare the dilute A solution. Various dilute B solutions were prepared from various CU-300 compositions all containing 80 ml/l sulfuric acid and each containing one of citric acid, tartaric acid or malic acid at 65 g/l. The reaction times were 60 seconds and the terminal pHs were about 1.1 to 1.2. The respective plating efficiencies were 6.3%, 9.1% and 18.2% for the citric, tartaric and malic acid containing compositions, respectively. This demonstrates that the plating process of the present invention is not limited to only one hydroxycarboxylic acid, and variations in the choice of acid depends on the skill of the operator. Similar substitutions using lactic acid and glycolic acid give similar reactions with efficiencies in the same range, but the dicarboxylic hydroxy acids (malic, citric, tartaric) tend to give smoother copper films.

Example 8

Because the amount of citric acid used in the CU-300 concentrated solution is a source of high cost to the process, the amount of citric acid was varied, while maintaining sufficient sulphuric acid to stay within a ph range of 1 to 3 for bright copper deposits. When using the technique for depositing copper described in the previous examples, and varying the citric acid from 40 g/l to 120 g/l, the highest plating efficiency occurs between 50 and 70 g/l (sulfuric acid fixed at 80ml/l). For instance, at 55 g/l citric acid, efficiency was 13%, at 40 g/l it was 9%, and at 120 g/l it was 8%. While the use of extremely low and extremely high amounts of citric acid may be less desirable from an efficiency standpoint, bright copper was still deposited. Similar tests with tartaric and malic acids showed similar results. Therefore, the process of the present invention is not dependent on any particular concentration of hydroxycarboxylic acid. However, the mineral acid should be used in sufficient amounts to bring the final pH of the reaction within the desired range, usually a pH of 1 to 3.

Example 9

It is desirable to make a dilute cuprous hydroxide solution A with the least amount of agglomeration. The rate of settling out by gravity of the cuprous hydroxide in a stationary vertical glass cylinder was found to be the preferred technique. The cuprous hydroxide solution A with the least or slowest rate of settling also gave the most uniform copper deposits when the thin copper layers were viewed by transmitted light from a high intensity lamp. Although the use of anti-agglomeration agents is not needed to obtain copper deposits, they are highly desirable to obtain a uniform deposit when the process is to be used to make copper mirrors or to plate the back of a silver mirror with copper. The anti-agglomeration substance must be contained in either of the CU-275, CU-1C, or CU-200 concentrated solutions before they are diluted and reacted to make the cuprous A solution. In this process, it was desirable to add a substance to the reaction which would allow the cuprous hydroxide to hydrogen bond to the sustance rather than to each other, thus avoiding large clusters of cuprous hydroxide. Observations were taken of the settling rate after 15 minutes of resting. In this case the additives were placed into the CU-275 prior to making the A solutions. The following results were obtained, where percent of settling refers to the height of clear solution above the total height of the column, and a lower percent indicates more dispersion and less agglomeration.

| Additive | Amount | Percent of Settling |
|---|---|---|
| No additive | — | 65% |
| Dextrose | 30 g/l | 20% |
| Fructose | 30 g/l | 52% |
| Glucono-delta-lactone | 30 g/l | 65% |
| Sodium glucoheptanate | 30 g/l | 50% |
| L-sorbose | 30 g/l | 30% |
| Invert sugar | 30 g/l | 30% |
| Sucrose | 30 g/l | 40% |
| D-galactono-gamma-lactone | 30 g/l | 55% |
| Glycine | 30 g/l | 52% |
| D-mannose | 30 g/l | 50% |
| D-galactose | 30 g/l | 70% |

Further experimentation showed that a desirable range of these polyols was from about 10 to 100 g/l in the CU-275 solution, but the range of experimentation of about 1 to 200 g/l showed that 65 to 75 g/l of polyol is preferred. In all cases, the use of polyols resulted in a more uniform deposit of metallic copper.

Example 10

A test run of the ammonia-free copper disproportionation process of the present invention was carried out on a horizontal, continuously moving mirror making conveyor which normally uses the ammoniated copper process described in the Sivertz et al. '842 patent. Sheets of soda lime float glass were placed on the loading end of the conveyor with the atmosphere side facing up. All mirror making procedures were carried out on this top side which first comprised of scrubbing, sensitization, and silvering as described in the BahIs '702 patent. The metallic silver coating on the glass was 75 mg per square foot (807 mg/m$^2$), which is within the typical range of 70 to 90 mg per square foot (750–970 mg/m$^2$) for modern silver glass mirrors. After the aqueous by-products of the silvering process were blown off the glass, followed by a deionized water rinse, a copper layer was deposited as follows on the silver coated glass while it moved down the mirror making conveyor.

In this test of the present invention, the reactants for the coppering process as previously described, CU-100, CU-200 and CU-300 (using citric acid), were continuously diluted with water using well known apparatus which measures the pumping rate of the reactants and the dilution water flow rates prior to application of the reactants on the silvered glass. In this particular case the silvered glass passed under the coppering section of the conveyor at a process rate of 62 sq. ft. per minute (5.8 m$^2$/min). CU-100 and CU-200 were pumped at 305 and 73 ml per minute, respectively, into the same water stream of 945 ml per minute and allowed to react for about 3 minutes by flowing through a small reaction chamber to form diluted solution A. CU-300 was pumped at 305 ml per minute into a water stream of 1130 ml per minute to form dilute solution B. Solutions A and B were allowed to flow continuously, but were sprayed separately, so that they mixed together just as they were applied to the silvered glass surface as it traveled under the spray area. The spray nozzles were moved back and forth by a traverse device in order to obtain a uniform distribution of the mixed solutions A and B on the silvered glass. The initial color of the reactants on the silver surface was a hazy orange which instantly began to deposit metallic copper on the silver, transforming the appearance of the silvered surface to that of a coppered surface. A pH of 1.5 was measured for the reaction After a 1 minute reaction, the reactants were removed with a deionized water rinse and the mirror blown dry with clean air. The resultant copper coating was bright, continuous, and without visible defects. The weight of the copper deposit was found to be 34 mg per square foot (366 mg/m$^2$). The calculated copper deposition efficiency for the reaction was about 13 %. The dried silvered and coppered glass mirror was allowed to continue down the conveyor into a protective paint coating section and then into a drying oven to produce the finished silver glass mirror. Samples of the mirror were found to be at least equal in corrosion resistance to those made by the ammoniated copper process as described by Sivertz et al. '842 patent when tested for 300 hours by the standard 20% salt spray test known to the mirror industry. The effluent from the coppering process was passed through an ion-exchange column to recover the copper ions, and the ammonia free effluent, after pH adjustment, was discharged to the sewer system, thus avoiding costly ammonia removal or destruction procedures.

The present invention provides a highly stable cuprous hydroxide complex that does not deteriorate when exposed to the atmosphere. As a result, this process may be used without the complicated equipment employed in the prior art which maintained the solution in a substantially oxygen-free environment. The cuprous hydroxide can be prepared well before it is to be used and stored in an open container without the need to exclude oxygen. When the copper is to be deposited on the desired activated substrate, the cuprous hydroxide solution may be added to a tank open to air, dispersed by a mixer, and then pumped to sprayers for distribution onto the substrate. Similarly, the activator solution may be added to an open-to-air tank to be sprayed simultaneously onto the substrate with the cuprous hydroxide solution. Alternatively, the cuprous hydroxide solution and the activator solution may be mixed together just prior to spraying and sprayed out of the same nozzle or orifice. The reaction rate of the process may be controlled, and the overall efficiency is improved. The deposited metallic copper film is more resistant to corrosion and does not readily tarnish upon exposure to water vapor. Finally, ammonia is eliminated from the process, and the amount of organic acid activator is substantially reduced, thereby providing substantial environmental and cost benefits.

It will thus be seen that the objects set forth above, among those made apparent from the preceding description, are efficiently attained and, since certain changes may be made in the above constructions without departing from the spirit and scope of the invention, it is intended that all matter contained in the above description shall be interpreted as illustrative and not in a limiting sense.

While the invention has been illustrated and described in what are considered to be the most practical and preferred embodiments, it will be recognized that many variations are possible and come within the spirit and scope thereof, the appended claims therefore being entitled to a full range of equivalents.

Thus, having described the invention, what is claimed is:

1. A process for the deposition of metallic copper on a catalytically activated surface comprising providing cupric ions in aqueous solution, adding to said cupric ions an ammonia-free reducer to rapidly reduce said cupric ions to cuprous hydroxide, and thereafter effecting disproportionation of the resultant cuprous hydroxide to bring about the deposition of metallic copper principally on said surface.

2. The process of claim 1 wherein said ammonia-free reducer comprises hydroxylamine or its salts.

3. The process of claim 1 wherein said ammonia-free reducer comprises hydroxylamine or its salts, and further including adding a water soluble alkali metal- or alkaline earth metal- hydroxide to reduce said cupric ions to cuprous hydroxide.

4. The process of claim 1 wherein said reduction of cupric ions is further effected by adding to said solution an antiagglomerating agent for controlling the dispersion of said cuprous hydroxide.

5. The process of claim 4 wherein said antiagglomerating agent is a polyol.

6. The process of claim 4 wherein said antiagglomerating agent is selected from the group consisting of dextrose, fructose, glucono-delta-lactone, sodium glucoheptonate, L-sorbose, invert sugar, sucrose, D-galactono-gamma-lactone, 2-keto-D-gluconic acid, glycine, D-mannose, and D-galactose.

7. The process of claim 4 wherein said antiagglomerating agent is sorbose.

8. The process of claim 4 wherein said antiagglomerating agent is invert sugar.

9. The process of claim 1 wherein said disproportionation of said cuprous hydroxide is effected by adding an activator comprising a hydroxycarboxylic acid or salt thereof to bring about the deposition of metallic copper principally on said catalytically activated surface, the improvement wherein said hydroxycarboxylic acid or salt activator is present in solution in an amount less than about one mole per mole of cuprous hydroxide.

10. The process of claim 1 wherein said disproportionation of said cuprous hydroxide is effected by adding an activator comprising a hydroxycarboxylic acid or salt thereof to bring about the deposition of metallic copper principally on said catalytically activated surface, the improvement wherein a rate modifier selected from the group consisting of Surfine, Rochelle salt (potassium-sodium tartrate), glycine, and is added to said hydroxycarboxylic acid or salt activator.

11. A process for the deposition of metallic copper on a catalytically activated surface by providing cupric ions in aqueous solution, adding a substantially ammonia-free reducer to rapidly reduce said cupric ions in aqueous solution substantially completely to cuprous hydroxide, and thereafter effecting disproportionation of the resultant cuprous hydroxide by adding an activator comprising a hydroxycarboxylic acid or salt thereof, which activator brings about the deposition of metallic copper principally on said catalytically activated surface, said hydroxycarboxylic acid or salt activator being present in solution in an amount no greater than about one mole per mole of cuprous hydroxide.

12. The process of claim 11 wherein said substantially ammonia-free reducer comprises hydroxylamine or its salts, and further including adding a water soluble alkali metal- or alkaline earth metal- hydroxide to reduce said cupric ions to cuprous hydroxide.

13. The process of claim 12 wherein said hydroxycarboxylic acid or salt activator-modifier further contains a mineral acid.

14. The process of claim 13 wherein said hydroxycarboxylic acid or salt activator-modifier is citric acid.

15. The process of claim 13 wherein said hydroxycarboxylic acid or salt activator-modifier is malic acid.

16. The process of claim 13 wherein said hydroxycarboxylic acid or salt activator-modifier is tartaric acid.

17. The process of claim 11 wherein said reduction of cupric ions is further effected by adding to said solution an antiagglomerating agent for controlling the dispersion of said cuprous hydroxide.

18. The process of claim 17 wherein said antiagglomerating agent is a polyol.

19. The process of claim 17 wherein said antiagglomerating agent is selected from the group consisting of dextrose, fructose, glucono-delta-lactone, sodium glucoheptonate, L-sorbose, invert sugar, sucrose, D-galactono-gamma-lactone, 2-keto-D-gluconic acid, glycine, D-mannose, and D-galactose.

20. The process of claim 17 wherein said antiagglomerating agent is present in an amount insufficient to effect reduction of said cupric hydroxide.

21. The process of claim 11 wherein a rate modifier selected from the group consisting of Surfine, Rochelle salt (potassium-sodium tartrate), glycine, and triethylenetetramine, is added to said hydroxycarboxylic acid or salt activator.

22. A system for depositing copper on a substrate by disproportionation of cuprous ions comprising the combination of:
an aqueous solution containing cupric ions,
an aqueous, ammonia-free cupric reducer solution containing a nitrogenous compound in a minimum concentration of about 25 g/l for reducing the cupric ions to a cuprous state,
an aqueous alkali metal or alkaline earth metal solution for precipitating cuprous ions as a cuprous precipitate, and
an aqueous activator solution containing a hydroxycarboxylic acid or salt thereof, an amine, or a mineral acid in combination with a hydroxycarboxylic acid or salt or amine, for disproportionation of the cuprous precipitate and deposition of copper on a substrate.

23. The system of claim 22 wherein said ammonia-free reducer comprises hydroxylamine or its salts.

24. The system of claim 22 wherein said ammonia-free reducer comprises hydroxylamine or its salts, and further including adding a water soluble alkali metal- or alkaline earth metal- hydroxide to reduce said cupric ions to cuprous hydroxide.

25. The system of claim 22 wherein said cupric solution, reducer solution or alkaline metal or alkaline earth metal solution further contains an antiagglomerating agent for controlling the dispersion of said cuprous hydroxide.

26. The system of claim 25 wherein said antiagglomerating agent is a polyol.

27. The system of claim 25 wherein said antiagglomerating agent is selected from the group consisting of dextrose, fructose, glucono-delta-lactone, sodium glucoheptonate, L-sorbose, invert sugar, sucrose, D-galactono-gamma-lactone, 2-keto-D-gluconic acid, glycine, D-mannose, and D-galactose.

28. The system of claim 25 wherein said antiagglomerating agent is present in an amount insufficient to effect reduction of said cupric ions.

29. The system of claim 25 wherein said antiagllomerating agent is sorbose.

30. The system of claim 22 wherein said aqueous activator solution comprises a hydroxycarboxylic acid or salt thereof in an amount no greater than about one mole per mole of cuprous hydroxide.

31. The system of claim 22 wherein said aqueous activator solution contains a rate modifier selected from the group consisting of Surfine, Rochelle salt (potassium-sodium tartrate), glycine, and triethylenetetramine.

32. A system for depositing copper on a substrate by disproportionation of cuprous ions comprising the combination of:
an aqueous solution containing cupric ions,
a substantially ammonia-free cupric reducer solution containing a nitrogenous compound in a minimum concentration of about 25 g/l for reducing the cupric ions to a cuprous state,
an aqueous alkali metal or alkaline earth metal hydroxide solution for precipitating cuprous ions as cuprous hydroxide, and
an aqueous activator solution containing a hydroxycarboxylic acid or salt thereof, said hydroxycarboxylic acid or salt thereof being present in an amount no greater than about one mole per mole of cuprous hydroxide, for disproportionation of the cuprous hydroxide and deposition of copper on a substrate.

33. The system of claim 32 wherein said alkali metal- or alkaline earth metal-hydroxide comprises sodium hydroxide.

34. The system of claim 32 wherein said hydroxycarboxylic acid or salt activator further contains a mineral acid.

35. The system of claim 32 wherein said hydroxycarboxylic acid or salt activator-modifier is citric acid.

36. The system of claim 32 wherein said hydroxycarboxylic acid or salt activator-modifier is malic acid.

37. The system of claim 32 wherein said hydroxycarboxylic acid or salt activator-modifier is tartaric acid.

38. The system of claim 32 wherein said cuprous reducer solution further contains an antiagglomerating agent for controlling the dispersion of said cuprous hydroxide.

39. The system of claim 38 wherein said antiagglomerating agent is a polyol.

40. The system of claim 38 wherein said antiagglomerating agent is selected from the group consisting of dextrose, fructose, glucono-delta-lactone, sodium glucoheptonate, L-sorbose, invert sugar, sucrose, D-galactono-gamma-lactone, 2-keto-D-gluconic acid, glycine, D-mannose, and D-galactose.

41. The system of claim 38 wherein said antiagglomerating agent is present in an amount insufficient to effect reduction of said cupric ions.

42. The system of claim 32 wherein said aqueous activator solution contains a rate modifier selected from the group consisting of Surfine, Rochelle salt (potassium-sodium tartrate), glycine, and triethylenetetramine.

43. The system of claim 42 wherein said aqueous activator solution further contains an additive selected from the group consisting of antioxidants, acidic complexers, boric acid, and surface active agents.

* * * * *

UNITED STATES PATENT AND TRADEMARK OFFICE
CERTIFICATE OF CORRECTION

PATENT NO. : 5,419,926                                  Page 1 of 2

DATED : May 30, 1995

INVENTOR(S) : Joseph Soltys

It is certified that error appears in the above-identified patent and that said Letters Patent is hereby corrected as shown below:

Column 4, line 43, "3,5" should be deleted.
Column 6, line 14, "5" should be deleted.
Column 6, line 31, " : " should be deleted from the "33%".
Column 7, line 2, "5" should not be subscript.
Column 7, line 62, "Supplier" should be inserted as a heading.
Column 7, line 67, "dupont" should be - - duPont - -.
Column 8, line 1, "dupont" should be - - duPont - -.
Column 8, line 4, "T075" should be - - OT75 - -.
Column 8, line 23, "T075" should be - - OT75 - - .
Column 8, line 58, "BahIs" should be - - Bahls - -.
Column 10, line 13, formula - -$[T_1/(T_1+T_2)]$ - - should be inserted before "X100".
Column 11, line 50, "100", before the word "provided" should be deleted.
Column 16, line 5, "triethylenetetramine" should be inserted after the word "and"

UNITED STATES PATENT AND TRADEMARK OFFICE
CERTIFICATE OF CORRECTION

PATENT NO. : 5,419,926
DATED : May 30, 1995
INVENTOR(S) : Joseph Soltys

It is certified that error appears in the above-indentified patent and that said Letters Patent is hereby corrected as shown below:

Column 16, line 52, "," should be deleted after the word —triethylenetramine—.

Column 17, line 29, "antiagllomerating" should be —antiagglomerating—

Column 13, line 64, "BahIs" should be —Bahls—.

Signed and Sealed this

Fifth Day of September, 1995

Attest:

BRUCE LEHMAN

Attesting Officer    Commissioner of Patents and Trademarks